United States Patent
Sardi et al.

(10) Patent No.: US 6,970,115 B1
(45) Date of Patent: Nov. 29, 2005

(54) CYCLE SLIP FRAMING SYSTEM AND METHOD FOR SELECTIVELY INCREASING A FRAME CLOCK CYCLE TO MAINTAIN RELATED BITS WITHIN THE SAME PARALLEL-OUTPUT FRAME OF A DESERIALIZER

(75) Inventors: Mohamed Sardi, Santa Clara, CA (US); Paul Scott, San Jose, CA (US); Sean Foley, Co. Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/876,985

(22) Filed: Jun. 25, 2004

Related U.S. Application Data

(60) Provisional application No. 60/483,378, filed on Jun. 27, 2003.

(51) Int. Cl.$^7$ .......................... H03M 9/00; H04J 3/07; H04L 7/00
(52) U.S. Cl. ................ 341/100; 370/506; 375/371
(58) Field of Search ................ 341/100, 101; 370/505, 506; 375/355, 371, 373, 376

(56) References Cited

U.S. PATENT DOCUMENTS

| | | | | |
|---|---|---|---|---|
| 4,674,088 A | * | 6/1987 | Grover | 370/506 |
| 5,128,940 A | | 7/1992 | Wakimoto | |
| 6,154,509 A | * | 11/2000 | Bishop | 375/371 |
| 6,625,240 B1 | * | 9/2003 | Miyahara | 375/366 |
| 6,696,995 B1 | | 2/2004 | Foley et al. | |
| 6,876,630 B1 | * | 4/2005 | Shim | 370/242 |

\* cited by examiner

*Primary Examiner*—Howard L. Williams
(74) *Attorney, Agent, or Firm*—Kevin L. Daffer; Daffer McDaniel, LLP

(57) ABSTRACT

A system and method are provided for synchronizing a frame of related bits output from a deserializer to the related bits serially fed to the deserializer. Synchronization is achieved by overcoming a slip bit problem by selectively increasing the frame clock cycle during times in which the slip bit occurs. The deserializer is controlled by a clock generator that can include a counter which generates the frame clock. The counter can be asynchronously or synchronously reset, without any glitches occurring within the deserializer and, thus, avoiding any invalid bits output from the deserializer. The asynchronous reset forces the counter to a deterministic state, and the synchronous reset sets the counter to a valid state. In each instance, however, resets do not impart glitches to the deserializer and the deserializer output frame is maintained synchronous to related bits serially fed to the deserializer.

20 Claims, 10 Drawing Sheets

CYCLE SLIP FRAMING SYSTEM AND METHOD FOR SELECTIVELY INCREASING A FRAME CLOCK CYCLE TO MAINTAIN RELATED BITS WITHIN THE SAME PARALLEL-OUTPUT FRAME OF A DESERIALIZER

PRIORITY APPLICATION

The present application claims priority to provisional application No. 60/483,378 entitled "Cycle Slip Framing Scheme," filed Jun. 27, 2003.

BACKGROUND OF THE INVENTION

1. Field of the Invention

This invention relates to electronic circuitry and, more particularly, to a cycle slip framing system and method for use in communication circuits. The cycle slip framing system and method uses a clock generator coupled to a deserializer for selectively adding a bit clock cycle to one or more successive frame clock cycles in order to ensure a character framed by the frame clock and output from the deserializer as a parallel set of related bits matches a character fed to the deserializer as a serial set of related bits clocked by the bit clock.

2. Description of the Related Art

The following descriptions and examples are not admitted to be prior art or conventional by virtue of their inclusion within this section.

Communication between nodes of a communication system typically involves a serial bitstream. Examples of serial bitstream transfer protocols include Ethernet and Synchronous Optical Network (SONET), as well as numerous others. An integral part of the serialized communication between nodes is the transceiver associated with each node. A transceiver having both a receiver and a transmitter functions not only to recognize the transfer protocols, but also converts the serial bitstream to multiple bitstreams if necessary. The conversion from a relatively high bit rate serial bitstream to a set of relatively low bit rate parallel bitstreams takes place within a receiver and, more specifically, within a deserializer of the receiver.

The serializer and deserializer of the transceiver are normally found within the physical media attachment (PMA) sub-layer of the transceiver. The serializer/deserializer is responsible for supporting multiple communication protocols and allows presentation of encoding schemes to the upper layers of, for example, the Open System Interconnection (OSI) model. A useful feature of a deserializer within the physical layer PMA of the OSI model is that the deserializer can frame its output once synchronization between its serial bitstream of related bits are synchronized to parallel output of related bits.

Framing is used in the normal mode to reframe data in backplane transceivers and, as such, is an integral part of the IEEE 802.3z Gigabit Ethernet and Fibre Channel Standards set forth in http://www.ieee.org and http://www.fibrechannel.org. Framing of serial data is, therefore, the conversion of the serial bitstream to respective frames output in parallel from the deserializer. Certain bits within the serial bitstream are related to one another and thus belong within the same frame output from the deserializer.

Framing can be used for built-in-self-test (BIST) purposes. Many transceiver chips include a pseudo-random bitstream (PRBS) generator in the transmitter channel and a corresponding verification block in the receiver. The function of the verification block is to determine if the received set of related bits (i.e., transmitter-generated character) matches a set of related bits (i.e., receiver-generated character) formed in the verification block of the receiver. Ideally, the transmitter-generated character must match the receiver-generated character at the parallel output of the deserializer. Unfortunately, however, certain related bits can slip from one frame to another depending on the internal operations of the deserializer.

FIG. 1 illustrates a receiver within a communication system transceiver. The receiver 10 includes both a deserializer 12 and clock generator 14. As the serial bitstream 16 is received by deserializer 12, certain related bits (e.g., character $A_0$–$A_{15}$) are placed in a single frame and output in parallel, as shown by reference numeral 18. The frame of related bits can then be executed upon by core logic 20. A bit clock which transitions according to a bit clock cycle samples the serial bitstream onto the deserializer. Frame 18 transitions from one frame to the next according to a frame clock that transitions within a frame clock cycle.

There are numerous types of deserializers known in the industry. For example, a deserializer can be formed from shift registers. As the serial bitstream is received on the shift registers, the bit clock will shift serial bits into and through the registers, and a character, or frame of related bits, is captured each time the shift registers are filled, once per frame cycle. Another type of deserializer involves a staged or pipelined deserializer. A pipelined deserializer is shown in FIG. 2 as having four stages that will time-division demultiplex an incoming serial bitstream 16 of, for example, 16 bits. Each stage can be clocked by a successively slower clock rate, with the first stage being clocked at ½ the bit rate, and the second stage being clocked at ¼ the bit rate. The clocks sent from a clock generator to deserializer 12 at successive one-half preceding rates are shown as reference numerals 20a–20d. The last stage presents the deserialized frame of related bits 0–15 as shown by reference numeral 22.

The pipelined deserializer architecture is described in U.S. Pat. No. 5,128,940 herein incorporated by reference. Each of the 1-to-2 demultiplexer cells of FIG. 2 is illustrated in FIG. 3 as reference numeral 24. The 1-to-2 demultiplexer cell 24 essentially includes two D-type flip-flops 26 and 28, and a latch 30. Instead of using, for example, two master-slave DFFs for each cell, cost savings can be realized by using latches. The smaller design is set forth in U.S. Pat. No. 6,696,995 herein incorporated by reference.

Regardless of the cell architecture, a 1-to-2 demultiplexer cell samples the incoming serial bitstream at approximately one-half the bitstream rate (f/2 clk), as shown in the timing diagram of FIG. 4. The odd bits (bits a, c, e, etc.) are sampled on the trailing edge of the input clock by DFF 26, and the output of DFF 26 is sampled on the leading edge of the input clock by latch 30 so that the odd bits are aligned with the even bits (bits b, d, f, etc.) that are output from DFF 28.

While pipelined deserializers typically enjoy power saving advantages over conventional shift register deserializers and state machines that sample at the serial bitstream rate, pipelined deserializers typically use multiple latches and flip-flops within each demultiplexer cell. Moreover, as described in U.S. Pat. No. 5,128,940, due to margin differences from one demultiplexer cell to another, related bits $A_0$–$A_{15}$ may not necessarily appear within the same frame output simultaneously from the final stage of the deserializer. This problem is oftentimes referred to as a "bit shift" or a "bit slip." A bit shift/slip can be caused by uncertainty in the initial period of the signal input. In order to detect a bit slip, many architectures utilize BIST and PRBS generators to verify if a bit slip has occurred, and to correct the bit slip situation.

One technique for correcting a bit slip occurrence is to apply control signals selectivity to the control clocks forwarded to each stage of the pipelined deserializer. As described in U.S. Pat. No. 5,128,940, logic gates 34 can receive the successively one-half rate clock signals from clock generator 14, along with control signals C0–C3. Depending on the logic state of the control signals, the clocking signals forwarded to each stage of the deserializer can be selectively inverted or non-inverted as shown. By inverting certain select clock signals within select stages, bits of data output from certain stages can be advanced or delayed relative to other bits.

While attempting to address the bit slip problem using logic gates 34 and control signals C0–C3, the bit slip problem may be exasperated. For example, the control signals are typically not synchronous with transitions of the bit clock cycle. Any deviation of the control signal edges will modify the clock signal outputs, even though the clock generator is synchronized to the bit clock. Deviations of the clock signals relative to the serial bitstream will cause the deserializer to encounter incoming jitter, and produce what are known as "invalid bits." The invalid bits will periodically occur in the interim between those clock differences at the output of the corresponding stages. The invalid bits will ripple through the pipelined architecture and produce unstable and inaccurate results at the output of the deserializer.

In addition, the solution offered in FIG. 5 is indigenous only to a pipelined deserializer. As noted above, there are numerous types of deserializers, such as shift registers or simply state machines that produce frames of parallel output corresponding to a serial bitstream. Having to produce selective clock signals for each successive one-half decreasing clock control signals is, at best, difficult to manage for all $2^M$ types bit shifting possibilities (where M equals the number of deserializer stages), and to maintain for deserializers called upon to deserialize bitstreams in excess of 1.0 GHz.

It would be desirable to introduce a mechanism that alleviates bit slip problems without having to utilize asynchronous control signals and $2^M$ bit shifting possibilities as shown in the solution of FIG. 5. Having M control signals, M control gates, and M asynchronous control signals, it is difficult to alleviate glitches from appearing on the outputs of the gates. Adding additional flip-flops as part of the clock generation scheme in order to avoid metastability and to ensure synchronous operation, only adds additional circuitry to an overall complex solution. It would be desirable to avoid the additional logic gates and/or flip-flops in a staged, pipelined deserializer solution. It would be even further desirable to implement a solution to the bit slip problem for not only pipelined deserializers, but other deserializers as well.

SUMMARY OF THE INVENTION

The problems outlined above are in large part solved by an improved communication system and, specifically, an improved transceiver within various nodes of that system. The transceiver includes a receiver having a deserializer and a frame clock generator. The deserializer includes any circuit or state machine operation that converts serialized bits of data to frames of data output in parallel. The serialized bits of data occur at a bit rate synchronous with a bit clock cycle. The frames of data occur at a frame rate synchronous with a frame clock cycle. The frame clock cycle is of a duration equal to N times the bit clock cycle, where N equals the number of related bits within a frame—hereinafter interchangeably referred to as a "character."

The frame clock generator generates all clocks needed by the serializer to place the parallel bits in successive frame cycles. The frame clock generator can selectively extend at least one of the successive frame cycles if a frame of parallel data output from the deserializer during a first frame cycle contains less than, for example, a character set of related bits forwarded serially into the receiver.

It is recognized that there may be a set of bits serially fed to the receiver that have a relationship to one another. Those bits must be packaged and simultaneously output from the deserializer within a single frame cycle. If not, then the relationship may be lost. By extending a frame cycle by approximately one bit cycle, all related data bits of a particular character serially forwarded to the deserializer can be captured in a single frame. If not, then successive frame cycles might each require a corresponding extension by one bit cycle until the frame cycle cumulatively shifts so that the boundary of bits sent in frames match with the boundary of bits representing characters sent to the deserializer.

If the deserializer is a 1-to-N deserializer, then one or more of the successive frame cycles can be extended by one bit cycle so that a cumulative shift in the frame cycle boundary occurs at the output of the deserializer. The deserializer can be a staged set of 1-to-2 demultiplexers clocked at successive one-half bit rates, or the deserializer can simply be a shift register or state machine whose output is clocked at the bit rate or possibly less than the bit rate.

According to another embodiment, a data framing system is provided. The system includes a N/2-staged counter configured to count N states. The system also includes a first logic gate coupled to forward a slip bit signal to the counter when the counter has reached a N/2 state. The system might also include a first flip-flop coupled to synchronize the slip bit signal to transitions of a bit clock, and to add the synchronized slip bit signal to an input of the counter preferably during the N/2 state to increase a frame clock cycle. The data framing system can operate "on demand" whenever it is desired to increase the frame clock cycle. The slip bit is, therefore, used only if an increase in the frame clock cycle is needed. If an increase in not needed in order to shift the frame boundary by one bit for each frame increase, then a slip bit is not used. Thus, the slip bit is selectively provided.

Yet further, a method is contemplated. The method includes sampling a set of N related bits within the serial data with N bit clock cycles. A slip bit can then be received that is synchronized to a transition of the bit clock cycle. A frame cycle used to sample the N bits of the serial data can then be increased to N+1 divided by N whenever one or more of the bits within the N related bits are absent from a frame sampled by the frame clock cycle. The frame clock cycle can avoid being increased if the set of N related bits are present within a frame sampled by the frame clock cycle.

BRIEF DESCRIPTION OF THE DRAWINGS

Other objects and advantages of the invention will become apparent upon reading the following detailed description and upon reference to the accompanying drawings in which.

Figure 1:
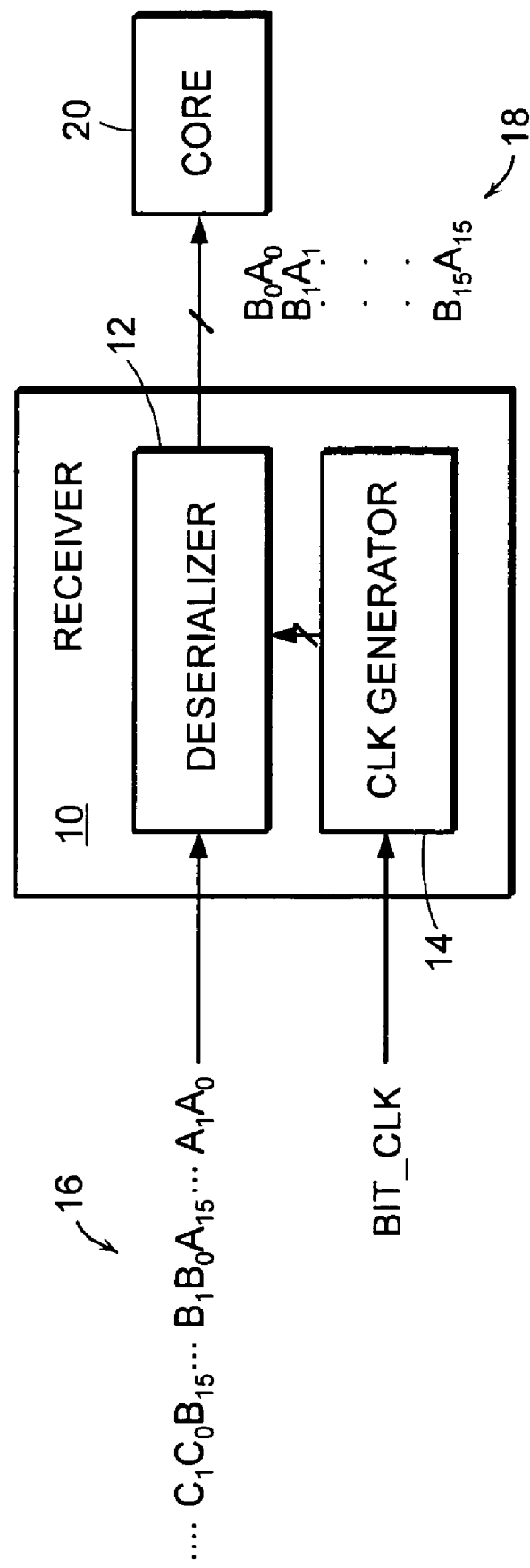
FIG. 1 is block diagram of a communication system having a receiver that receives serial data at a bit clock rate and deserializes the serial data at a frame clock rate.
Figure 2:
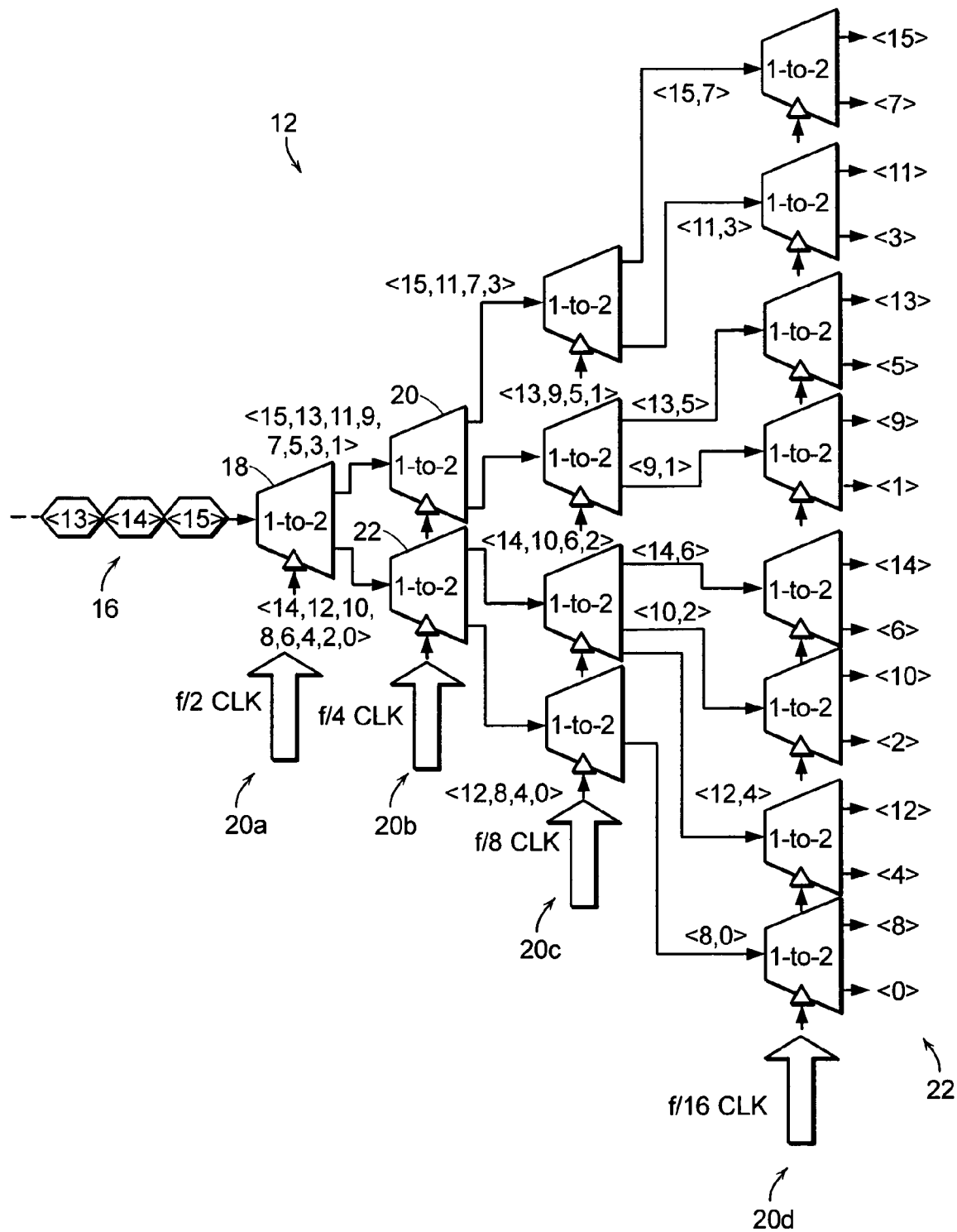
FIG. 2 is a circuit schematic diagram of a 1-to-N deserializer containing N−1 demultiplexers connected in pipelined stages.
Figure 3:
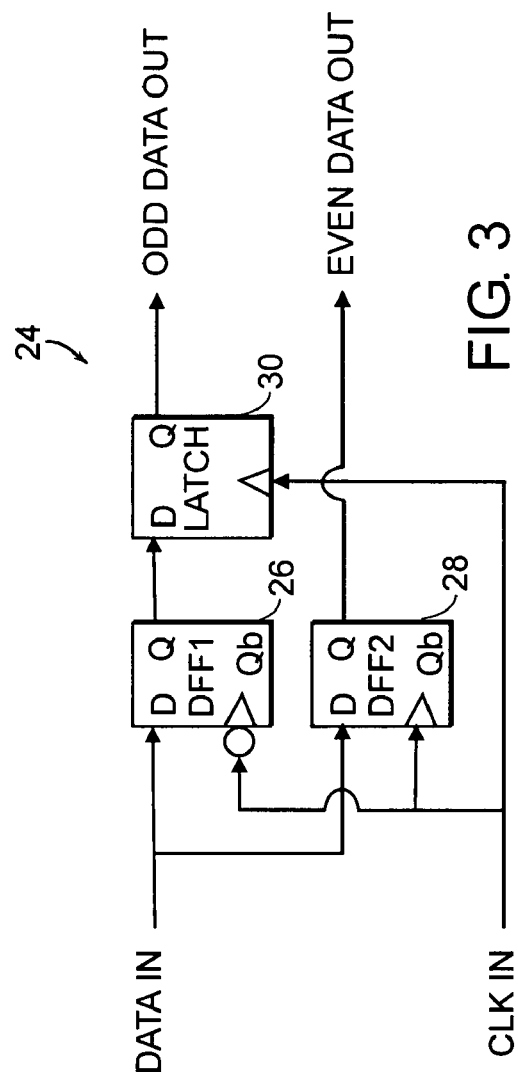
FIG. 3 is a circuit schematic diagram of a demultiplexer utilizing two flip-flops and one latch.
Figure 4:
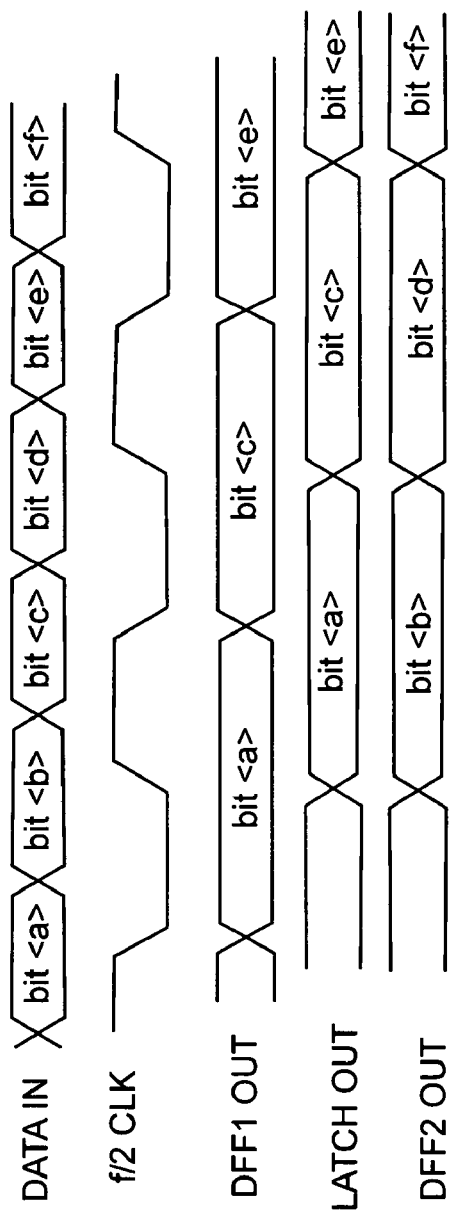
FIG. 4 is a timing diagram of the output produced from the demultiplexer of FIG. 3.
Figure 5:
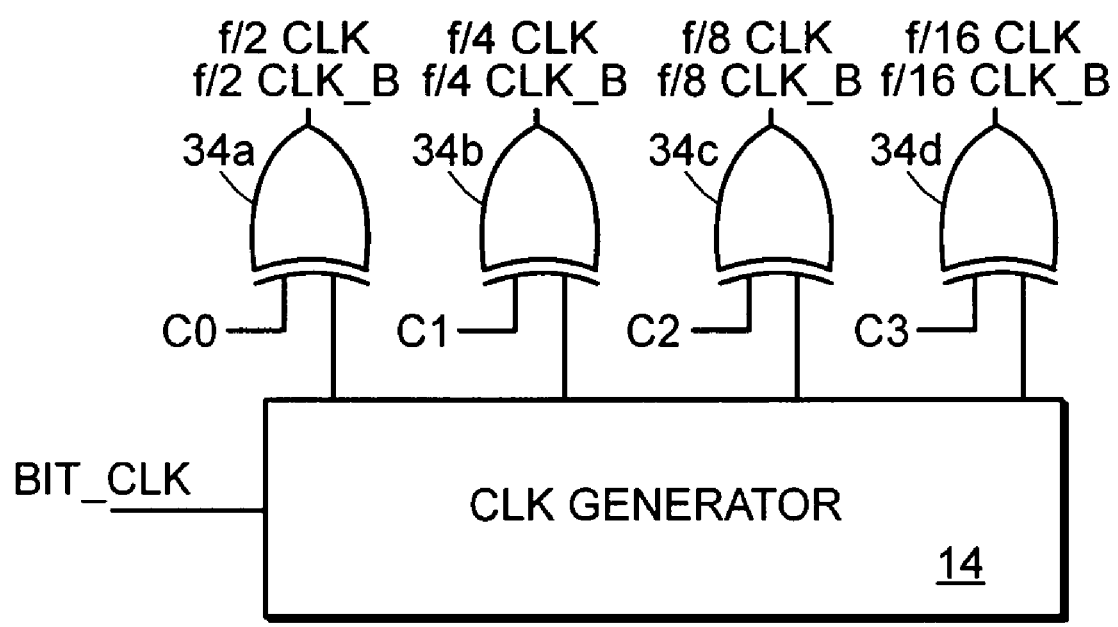
FIG. 5 is a circuit schematic diagram of a clock generator for controlling the 1-to-N deserializer of FIG. 2, with asynchronous control signals and logic gates used to selectively advance or retard select bits output from the pipelined stages.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Figure 6:
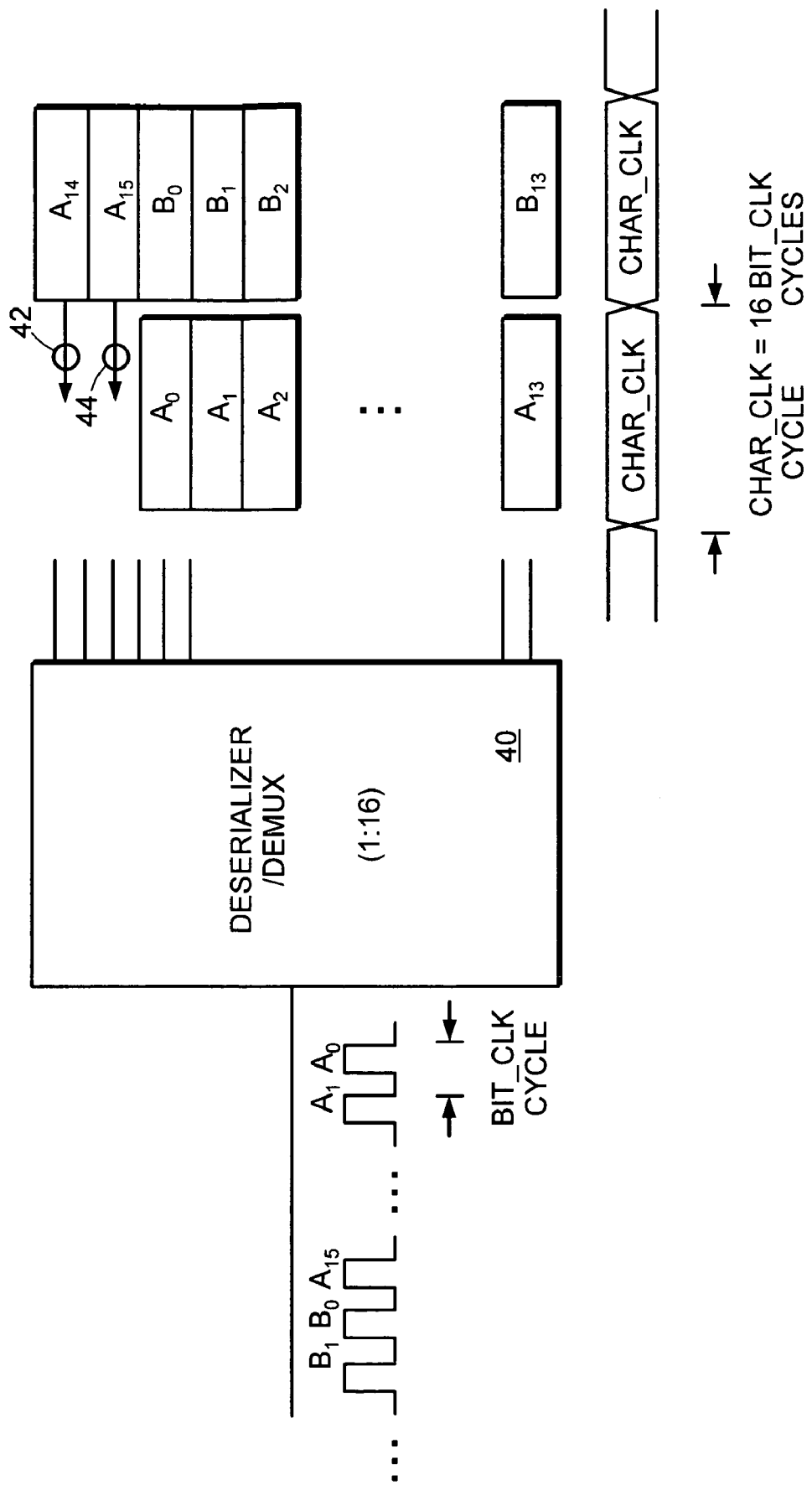
FIG. 6 is a plan diagram of a 1-to-N (N equals 16) deserializer having related serial-fed bits which form a character that is strewn or "slipped" between two successive frame cycles rather than all such related bits output from the deserializer in parallel within a single frame cycle.

Turning now to the drawings, FIG. 6 illustrates a deserializer 40 that receives groupings of serially fed bits. The first grouping of $A_0$–$A_{15}$ represents, for example, a character. Each bit is shown to occur at a bit rate and is synchronized to a bit clock cycle. A problem of conventional deserializers is that the related bits of a particular character (e.g., $A_0$–$A_{15}$) may fall into two successive frame clock cycles, rather than being simultaneously output within a single frame clock cycle, alternatively known as a character clock cycle (CHAR_CLK CYCLE). If the number of bits being deserialized equals 16, then the frame clock cycle or character clock cycle equals 16 bit clock cycles.

As shown, bits $A_0$–$A_{13}$ are in one frame clock cycle, whereas related bits $A_{14}$–$A_{15}$ are found in the succeeding frame clock cycle. In order to prevent the illustrated bit slip or bit shift of bits $A_{14}$–$A_{15}$, it is desired to implement an improved deserializer and frame clock cycle extension generator to place bits $A_{14}$–$A_{15}$ into the preceding frame cycle, as shown by arrows 42 and 44. In order to be advantageously marketable, the improved deserializer must take on any form beyond simply a pipelined deserializer, for example.

Since the bits $A_0$–$A_{15}$ are known to arrive in succession, extending the frame cycle by one bit cycle will bring forward the next bit in succession from the second frame into the first frame. Thus, if $A_{14}$ is the next bit in succession following $A_{13}$, then extending the first frame cycle will now encompass $A_{14}$. Detecting which bits have slipped can be performed by forming a special framing character of bits at the receiver and storing those bits into registers at the output of the deserializer. The parallel special framing character can then be compared with the same bit pattern as the special framing character sent from a transmitter to the receiver. If the transmitted bit pattern, detected at the output of the deserializer does not contain the same bit pattern as the special framing character, then a comparison between the register which holds the special framing character and the register which holds the deserialized, transmitted bit pattern can be compared to determine which of the transmitted bit(s) have slipped.

Figure 7:
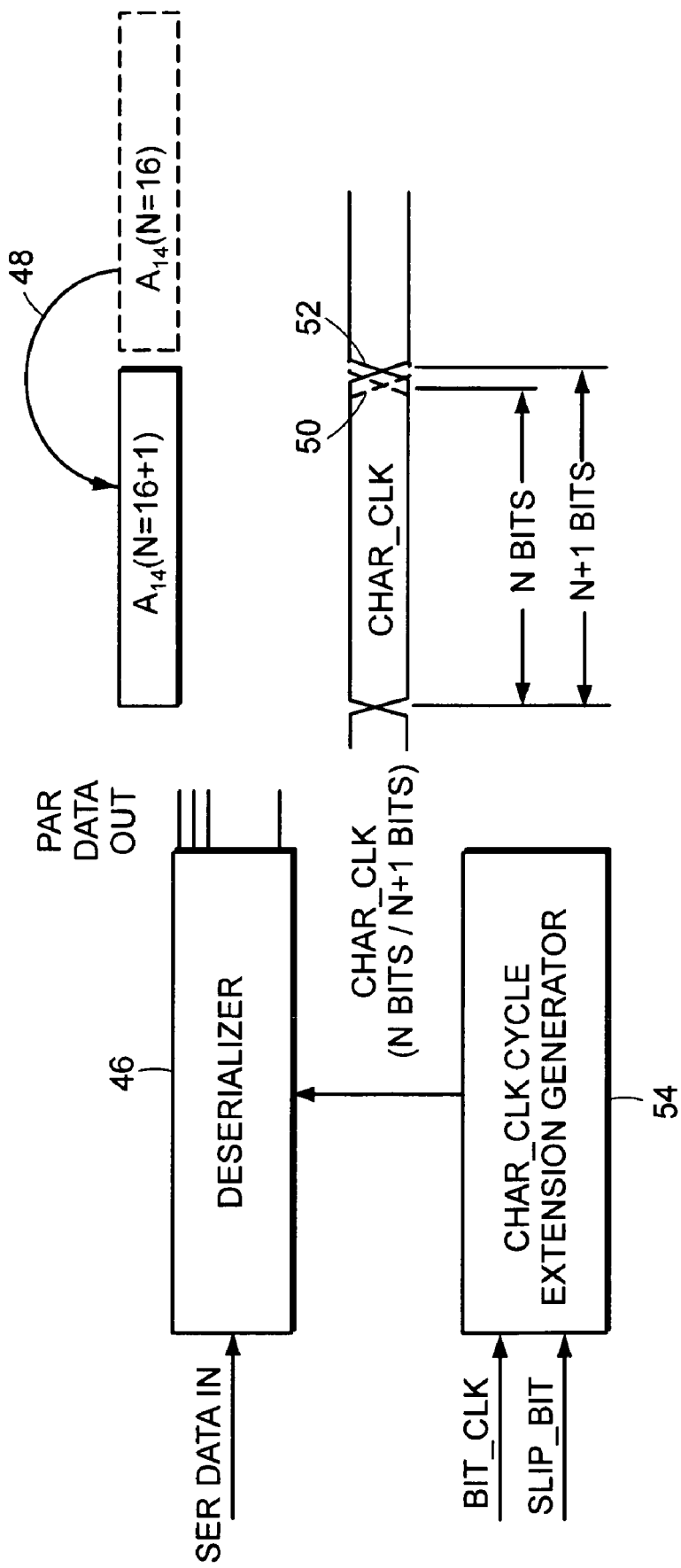
FIG. 7 is a plan diagram of the 1-to-16 deserializer having a bit cycle selectively added to the frame cycle to incrementally add bits of a serialized character to be captured within a single frame cycle.

FIG. 7 illustrates the improved deserializer 46 controlled by transitions of a bit clock cycle and/or a frame clock cycle. The frame clock cycle can be selectively extended to shift forward one or more bits within the serial bitstream. Thus, FIG. 7 indicates an extension of the frame clock cycle by generator 54 to move the related bits (e.g., $A_{14}$–$A_{15}$) forward by one frame clock cycle, as shown by arrow 48. The reason a bit can be moved forward to the preceding frame cycle is that the frame clock cycle can be selectively increased one bit cycle on demand. Thus, if it is determined, using a PRBS and BIST technique of a special framing character, that a bit is missing from the related bits output during a frame cycle, that bit can be moved forward from the successive frame cycle by adding one bit cycle to the preceding frame cycle, as shown by the differences between the phantom line boundary 50 and the extended boundary 52.

Figure 8:
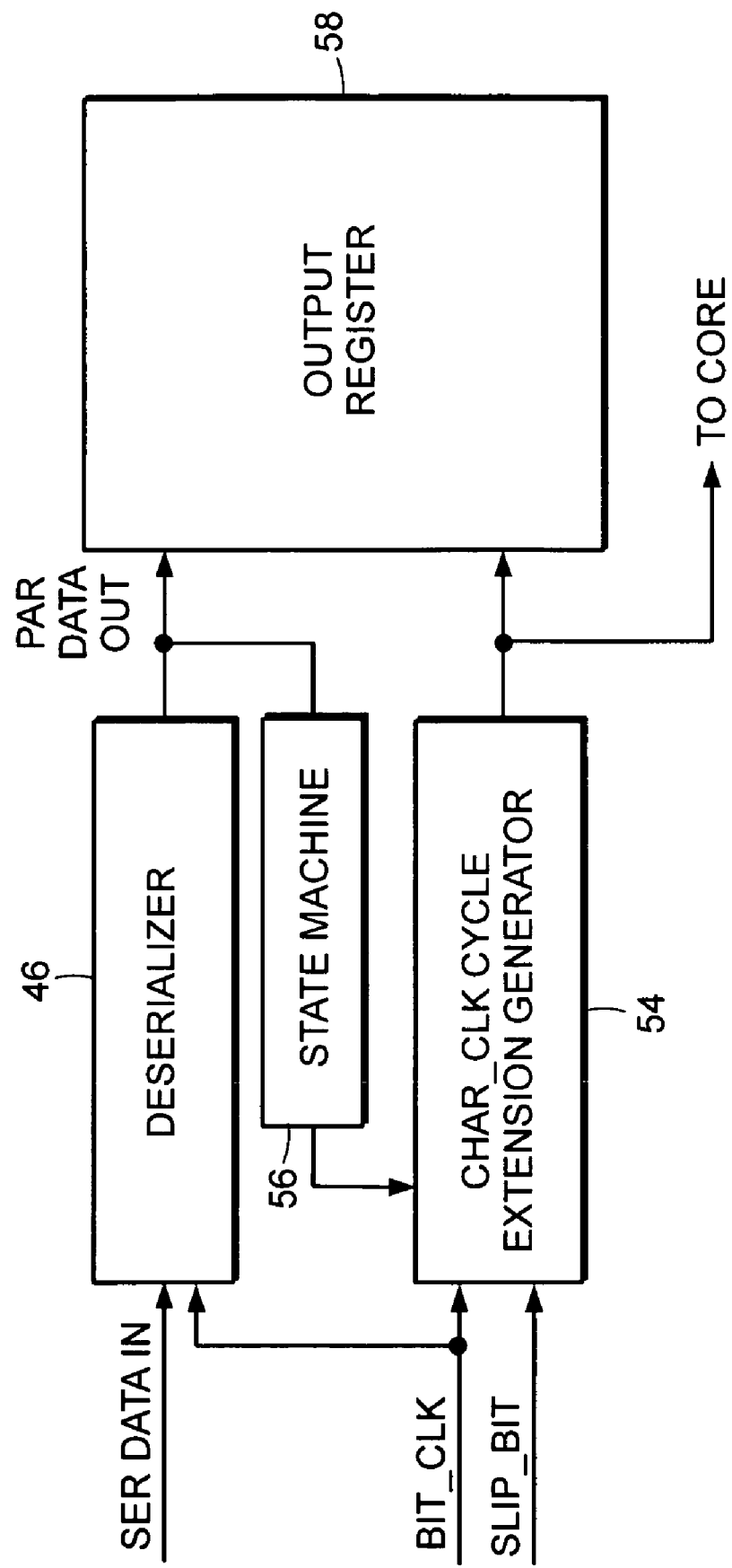
FIG. 8 is a block diagram of the output from the deserializer stored and synchronized to related bits within an output register controlled by a frame cycle extension generator, according to one embodiment.

FIG. 8 illustrates deserializer 46 and frame clock cycle extension generator 54 used to control deserializer 46. Any bit shifts which occur at the output of deserializer 46 are detected by a state machine 56 when performing BIST and special framing character generation/comparison, and then state machine 56 instructs generator 54 to extend a frame clock for the frame that will accommodate those related bits or for the next succeeding frame. The extended frame clock is, therefore, sent to an output register 58 as well as to the core circuitry. Thus, the rearranging of the frame clock boundary can occur either in the deserializer 46 or in the deserializer output (i.e., within the output register 58). State machine 56 determines essentially when to implement a slip bit from among the various frame cycles used to capture related bits that form a character.

FIGS. 7 and 8 thereby illustrate a deserializer circuit within a receiver and the ability of the deserializer circuit to move an imaginary character frame across the incoming serial data bitstream, one bit at a time. Thus, the deserializer will essentially slip back a slip bit on demand from the incoming serial data stream. Every time a bit is slipped back, the parallel data character sent from the deserializer represents a frame that has moved forward in the serial bitstream by one data bit.

Figure 9:
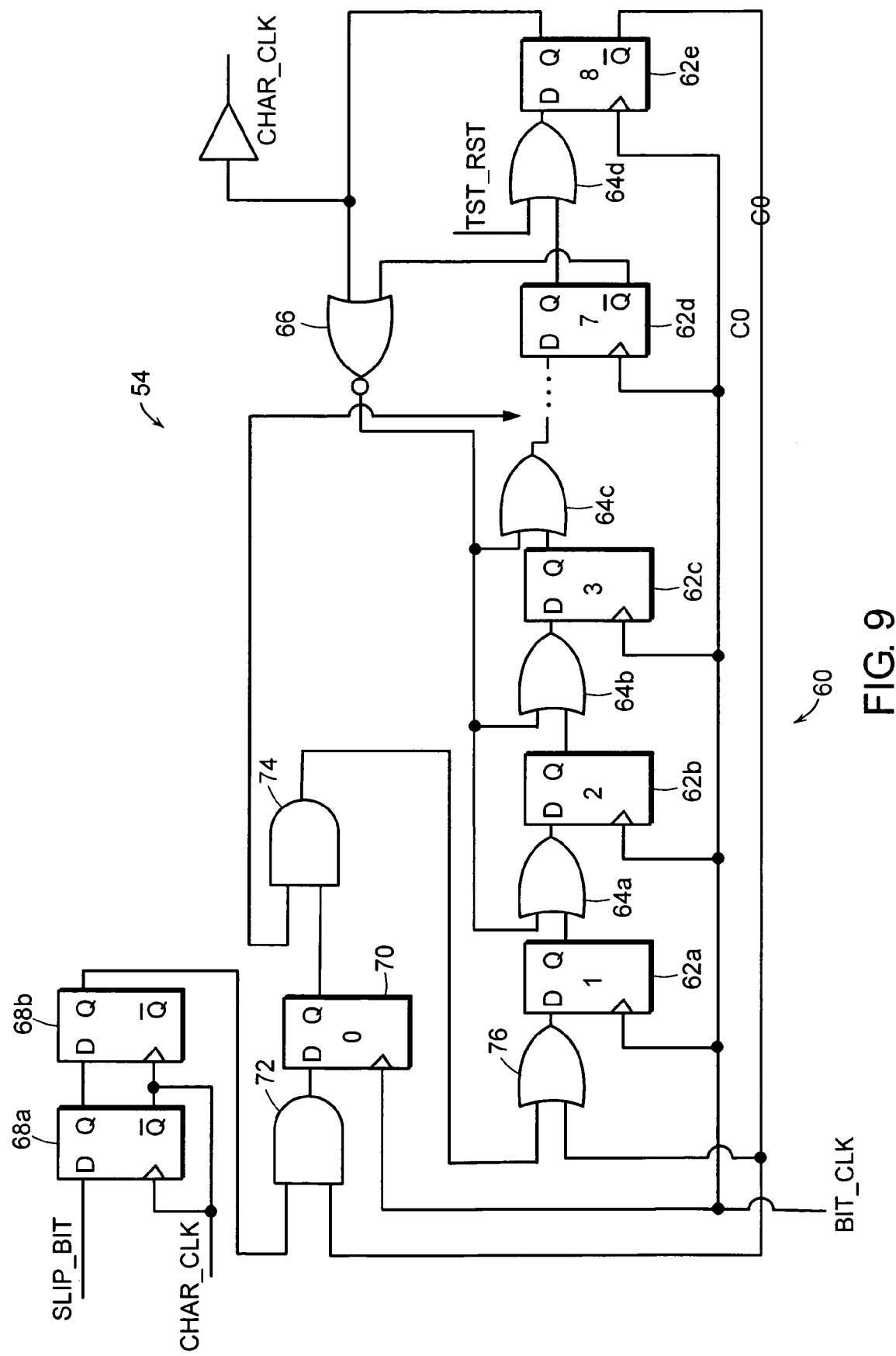
FIG. 9 is a circuit schematic diagram of the frame cycle extension generator for selectively adding a bit cycle within a frame cycle of N bit cycles.

FIGS. 7 and 8 illustrate how the deserializer is controlled by the clock generator to implement a bit-slip in the clock generator. The clock generator that can be selectively increased in frame cycle width output is illustrated in FIG. 9. Generator 54 utilizes a counter portion 60 which can be made from flip-flops connected in series. As shown, counter 60 can be made from N flip-flops 62. According to one example, a counter can basically be a shift register, with flip-flops coupled to shift logic levels through the flip-flops. In the example shown, the flip-flops can be D-type flip-flops and depending on the count required, there may be eight flip-flops if a 16-count is desired. Hence, for eight stages, there are 2×8 counts or 16 states.

Between each pair of flip-flops 62 might be reset circuitry implemented as, for example, an OR logic gate 64. Whenever the logic value at the complementary output of flip-flop 62d and the logic value at the output of flip-flop 62e represents a specific state, then NOR gate 66 will send a reset signal to one or more of the logic gates 64a, 64b, and 64c to reset counter 60 synchronously. For better robustness, a self-corrected circuitry can be used since a glitch occurrence might force counter 60 to enter into an invalid state from where the counter could never recover a valid state. NOR gate 66 can be connected to all eight OR gates input into each flip-flop. However, not to degrade the performance of counter 60, it may only be needed that the output of NOR gate 66 be input into three OR gates (as shown) in order to reduce the fan-out of the NOR gate 66.

In addition to the synchronous reset, it may be desired to periodically perform deterministic tests. To perform deterministic tests, a test reset signal is shown. The test reset signal can be asserted for eight clock cycles, in the example shown. While maintaining the test reset logic level, once the output from flip-flop 62d arrives upon logic gate 64d, then flip-flop 62e will output the appropriate logic value to initiate a reset by NOR gate 66. While the signal occurs asynchronously, reset nonetheless occurs synchronously. This avoids glitches and invalid states commonly associated with the conventional clock generation circuits and their use of control signals. Although any type of counter can be used, if a shift register configuration sometimes known as a Johnson counter is used, then eight flip-flops can be connected back-to-back and the reverted output of the last flip-flop is connected to the input of the first flip-flop in order to generate a 16 uniquely different state sequence.

The clock generation circuit 54 includes three additional flip-flops 68a, 68b, and 70, two additional AND gates 72 and 74, and an OR gate 76. The concept of the frame cycle extension or "stretch" scheme hereof is to force the counter 60 to assert or duplicate one state. This is performed using an asynchronous signal referred to as the slip bit (SLIP_BIT) signal of one character frame cycle length. The slip bit signal is passed through flip-flops 68a and 68b in order to reduce the risk of any metastability of that asynchronous signal. The slip bit signal then will become synchronized to the edges of the frame clock cycle since flip-flops 68a and 68b are clocked by the frame clock.

The synchronous slip bit signal is then connected to one input of AND gate 72 and, when the appropriate logic value occurs on the complementary output of flip-flop 62e, also then connected to the input of flip-flop 70. Flip-flop 70 is a positive edge-triggered D-type flip-flop that is clocked with the bit clock to produce an output that is then forwarded to AND gate 74. The AND gate 74 enables duplication of the state "111 . . . 11" when the slip bit signal is asserted. To reduce the fan-out of each gate and improve the speed performance, the duplication of the state "111 . . . 11" is anticipated by detecting the state "00001111." This mechanism is better illustrated in reference to FIG. 11.

Figure 11:
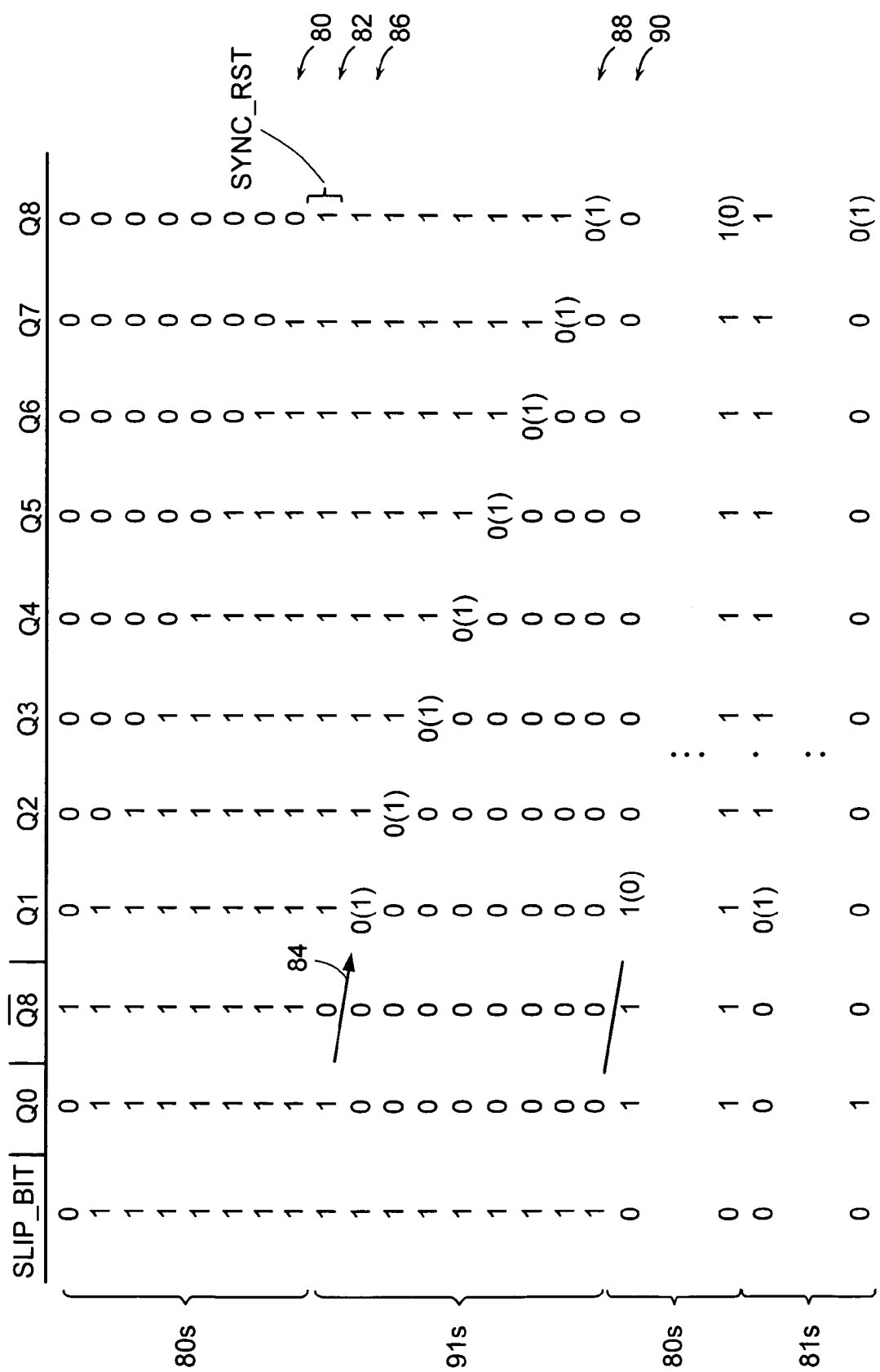
FIG. 11 is a table of bit values occurring at various nodes of the circuit of FIG. 9 during times when a slip bit is inserted into and absent from a frame cycle.

FIG. 11 illustrates the various states that exist within counter 60 of FIG. 9. Referring to FIGS. 9 and 11 in conjunction, the first row indicates a state in which no count has occurred and the asynchronous slip bit has not been asserted. However, once the slip bit has been asserted, then the output from flip-flop 70 (Q0) will rise to a logic 1 voltage value since the complementary output of flip-flop 62e (Q8 bar) is at a logic 1 voltage value. The logic 1 voltage value at the output of Q0 will not be forwarded to flip-flop 62a; however, flip-flop 62a output will already have a 1 logic value (Q1=1) since one input to OR gate 76 is at a logic high voltage value represented at Q8 bar. Thus, a logic 1 voltage value immediately appears on the counter 60 first flip-flop output to enter the second count state. Thereafter, the logic 1 values sequence through counter 60 as shown according to shift register mechanics. Once the eight state 80 occurs, output Q7 is different from output Q8 to cause the output from NOR gate 66 to transition high, thereby resetting each of flip-flop output to a logic 1 value, as shown by the ninth state 82. States 80 and 82 thereby illustrate the synchronous reset operation.

While the flip-flops are being reset, the slip bit signal remains asserted for the entire frame cycle and, thus, the logic 1 value on the output of Q0 is forwarded as shown by arrow 84, to the output Q1 upon the next bit clock cycle as shown by state 86. Thus, what would normally be a logic 0 value now appears as a logic 1 value indicated in parenthesis. The logic 1 voltage value will shift through the flip-flops until it arrives at the output of the last flip-flop at output Q8, as shown by state 88.

Between states 82 and 88 there are nine states rather than eight. As shown in the left-hand side of FIG. 11, there are nine 1's that appear on the output of Q8, preceded by eight 0's. Thus, instead of having 2N (where N=8) bit cycles which form a frame cycle, there are now 17 bit cycles. The addition of one bit clock cycle occurs when the Q0 output is placed upon and subsequently latched to the output Q1. State 90 illustrates what will occur if the slip bit signal is not asserted. In this case, the logic 0 voltage value on Q0 will convey to Q1 output; however, no additional bit cycle is needed. Thus, eight 0's will precede eight 1's for a total of N bit cycles which form the frame cycle beginning at state 90.

Figure 10:
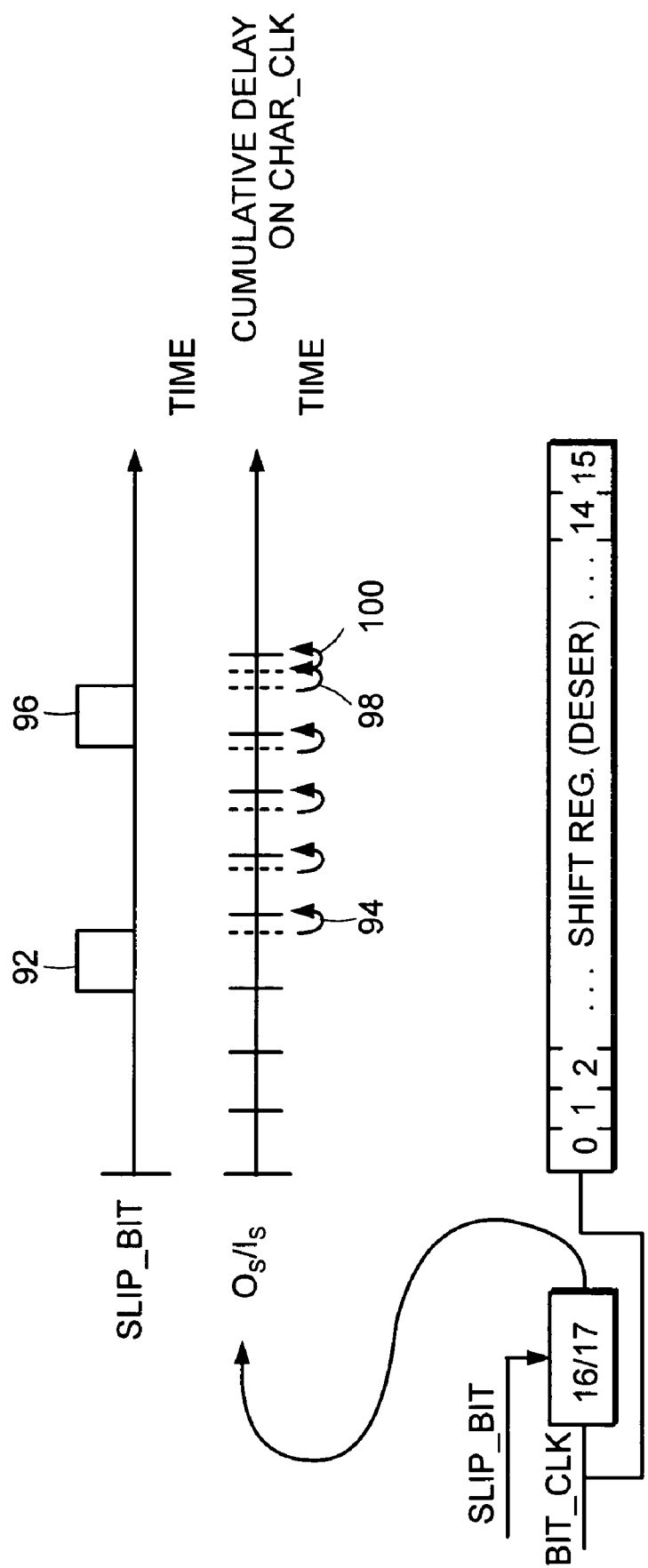
FIG. 10 is a timing diagram of cumulative delay imparted to successive frame cycles by placing a slip bit into successive frame cycles to synchronize the frame cycles to a frame boundary of related bits.

FIG. 10 illustrates the cumulative result of adding a slip bit to one or more frame cycles. The timing diagram illustrates application of a slip bit 92 during a frame cycle in which 0's and 1's are counted. During that frame cycle, an additional 0 or 1 can be counted to accommodate a slipped bit that, but for the slip bit signal, would appear in the ensuing frame cycle. However, by implementing the slip bit signal 92, the frame cycle is incremented by one bit cycle as shown by arrow 94. The incremental increase in frame cycle continues for all successive frame cycles. However, if another slip bit signal 96 is asserted, then the frame cycle is incremented again in size by a bit cycle, as shown by arrows 98 and 100.

FIG. 10 illustrates a cumulative shifting in the boundary of a frame cycle relative to the neighboring frame cycles. Depending on how many frame cycles undergo a slip bit signal, the cumulative effect will be to synchronize the boundary of the frame cycle to capture all related bits within a serial bitstream. As shown, insertion of two slip bit signals in successive frame cycles will allow the deserializer to advance two slipped bits that would normally fall in a subsequent frame cycle into the immediately preceding frame cycle. Thus, using two slip bit signals will allow bits $A_{14}$–$A_{15}$ (FIG. 6) to be advanced and placed into the immediately preceding frame cycle with bits $A_0$–$A_{13}$. FIG. 10 illustrates implementation of the slip bit feature in any type of deserializer, including a shift register deserializer or a pipelined deserializer. Thus, any deserializer which receives serial data and ideally captures related bits in a parallel output can be controlled by the frame clock extension generator, and the advantages of a slip bit inserted thereto.

Instead of requiring multiple control signals as in conventional designs, the improved frame cycle extension generator requires only one control signal—a slip bit control signal. The slip bit control signal, however, is made synchronous to the bit clock and the frame clock in order to remove glitches and any invalid states which might result therefrom. The deserializer and clock generator can be implemented in any technology, for example, CML, CMOS, TTL, etc. The N/(N+1) can be implemented following the same methodology by adding flip-flops in the Johnson counter and modifying the synchronous reset circuitry.

It should be appreciated that reference throughout this specification to one embodiment or an embodiment means that a particular feature, structure, or characteristic described in connection with the embodiment is included in at least one embodiment of the present specification. Therefore, it is emphasized that two or more references to an embodiment, one embodiment, or an alternative embodiment, in various portions of this specification are not necessarily all referring to the same embodiment. Furthermore, particular features, structures, or characteristics may be combined as suitable in one or more embodiments hereof.

Similarly, it should be appreciated that in the foregoing description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. The claims following the detailed description are hereby expressly incorporated into this detailed description, with each claim standing on its own as a separate embodiment of the claimed invention.

Accordingly, one embodiment is simply the use of a logical state machine to insert bit clock cycles to the frame clock cycle used by a deserializer. The logical state machine includes one or more sequential and combinatorial circuits, such as flip-flops and gate logic. The deserializer includes, for example, a pipelined deserializer, a shift register, a state machine, or any of the aforementioned architectures clocked at full rate, ½ rate, etc. While various figures illustrate certain counter sizes and states, it is contemplated that any number of counter stages and states are envisioned to be used in a receiver that receives high speed serialized data used, for example, in an OC-192 SONET transceiver.

The deserializer and clock generator use a lower gate count than conventional cycle slip framing mechanisms, and the deserializer can be used to sample bits directly for each cycle of the serial bitstream. The active edge of the sampling frame clock can thereby be moved one bit at a time to move the character frame forward by one data bit. The counter can be a self-clearing counter such as a Johnson counter, or any counter that can generate a frame clock cycle upon occurrence of the last state. All such features and enhancements are readily understood by one skilled in the art upon review of the following claims.

What is claimed is:

1. A data communication receiver, comprising:
  a deserializer coupled to receive a serialized first set of related data bits followed by successive sets of related data bits; and
  a frame clock generator coupled to forward successive frame cycles to the deserializer and further coupled to extend at least one of the successive frame cycles if a frame of parallel data output from the deserializer during a first frame cycle contains less than said first set of related bits.

2. The data communication receiver as recited in claim 1, wherein said one of the successive frame cycles is extended by one bit cycle substantially equal to the time needed to sample one bit of the first and successive sets of related data bits.

3. The data communication receiver as recited in claim 1, wherein said frame clock generator is coupled to cumulatively shift the boundary of the successive frame cycles each time a bit cycle is added to the successive frame cycles.

4. The data communication receiver as recited in claim 2, wherein the deserializer is a 1-to-N deserializer, and wherein each of the successive frame cycles is substantially equal to N number of bit cycles or, if extended, said at least one of the successive frame cycles is substantially equal to N+1 number of bit cycles.

5. The data communication receiver as recited in claim 1, further comprising a state machine that forwards a slip bit to the frame clock generator to extend said at least one of the successive frame cycles if the state machine detects that the frame of parallel data output from the deserializer is missing at least one of the first set of related bits.

6. The data communication receiver as recited in claim 1, wherein the slip bit transitions at substantially the same time as at least one of the successive frame cycles.

7. The data communication receiver as recited in claim 1, wherein the slip bit transitions at substantially the same time as one of bit cycle among N bit cycles that form a non-extended said at least one of the successive frame cycles or N+1 bit cycles that form an extended said at least one of the successive frame cycles.

8. The data communication receiver as recited in claim 1, wherein the deserializer is a staged set of 1-to-2 demultiplexers clocked at successive half bit rates, or a shift register whose output is clocked by the frame cycle.

9. The data communication receiver as recited in claim 1, wherein the frame clock generator is coupled to reset synchronously or asynchronously with transitions of a bit cycle used to sample the first and successive sets of data bits serially forwarded to the deserializer.

10. A data framing system, comprising:
  a N/2-staged counter configured to count N states;
  a first logic gate coupled to forward a slip bit signal to the counter when the counter has reached an N/2 state; and
  a first flip-flop coupled to synchronize the slip bit signal to transitions of a bit clock used to sample incoming serialized data bits and to add the synchronized slip bit signal to an input of the counter during the N/2 state to increase a frame clock having transitions synchronized to when the counter has reached the N state.

11. The data framing system as recited in claim 10, wherein the frame clock is increased by N+1/N number of bit clock cycles.

12. The data framing system as recited in claim 10, wherein the counter comprises N/2 number of serially coupled flip-flops.

13. The data framing system as recited in claim 12, further comprising a NAND gate coupled to receive a complementary output from the second to the last N/2 number of serially coupled flip-flops and an output of the last N/2 number of serially coupled flip-flops to synchronously reset the counter when the counter has reached the N/2 state.

14. The data framing system as recited in claim 12, further comprising a OR gate coupled to receive an output from the second to last N/2 number of serially coupled flip-flops and an asynchronous test reset signal to reset the counter in sync with the bit clock when the output from the second to last N/2 number of serially coupled flip-flops and the asynchronous test reset signal are both at a logic low voltage value.

15. The data framing system as recited in claim 10, wherein the frame clock transitions in sync with N data bit clock cycles if the frame clock is not increased and wherein the frame clock transitions in sync with N+1 data clock cycles if the frame clock is increased.

16. A method for framing serial data, comprising:
sampling a set of N related bits within the serial data with N bit clock cycles;
receiving a slip bit synchronized to a transition of a bit clock cycle; and
increasing a frame clock cycle used to sample N bits of the serial data by N+1/N whenever the set of N related bits are absent from a frame sampled by the frame clock cycle.

17. The method as recited in claim 16, further comprising avoiding increasing the frame clock cycle used to sample N bits of the serial data if the set of N related bits are present within a frame sampled by the frame clock cycle.

18. The method as recited in claim 16, wherein said increasing comprises adding one bit clock cycle to the frame clock cycle.

19. The method as recited in claim 16, further comprising counting N states and receiving the bit slip during the N/2 state.

20. The method as recited in claim 16, further comprising resetting said counting during a transition of the bit clock cycle.

* * * * *